United States Patent [19]

Silvernail et al.

[11] Patent Number: 4,682,614
[45] Date of Patent: Jul. 28, 1987

[54] WAFER PROCESSING MACHINE

[75] Inventors: James M. Silvernail, Maple Plain; Dallas J. Schneider, Cologne, both of Minn.

[73] Assignee: FSI Corporation, Chaska, Minn.

[21] Appl. No.: 759,426

[22] Filed: Jul. 26, 1985

[51] Int. Cl.⁴ ............................................. B08B 3/02
[52] U.S. Cl. ................................. 134/99; 134/153; 134/154; 134/155
[58] Field of Search ............... 134/99, 140, 149, 153, 134/154, 155, 158, 159, 157, 186, 200; 68/181 R, 205 R, 208; 494/60; 210/488; 118/326; 34/181; 220/DIG. 6

[56] References Cited

U.S. PATENT DOCUMENTS

| | | | |
|---|---|---|---|
| 39,466 | 8/1863 | Cogswell et al. | 34/181 |
| 3,990,462 | 11/1976 | Elftmann et al. | 134/140 X |
| 4,132,567 | 1/1979 | Blackwood | 134/153 X |
| 4,300,581 | 11/1981 | Thompson | 134/140 X |
| 4,319,411 | 3/1982 | Steffen | 98/55 X |

FOREIGN PATENT DOCUMENTS 54575 3/1938 Denmark .............................. 68/208

*Primary Examiner*—Philip R. Coe
*Attorney, Agent, or Firm*—Palmatier & Sjoquist

[57] ABSTRACT

Centrifugal processing machine for spray processing wafers of silicon and the like the machine having a processing chamber closed by a door and having a generally horizontal orientation with the rotor also substantially horizontally oriented. The peripheral sidewall of the process chamber has an offset defined by overlapping edge portions defining a circumferentially facing drainage slot, facing in the same direction as the rotor revolves; the process chamber being maintained under slightly positive pressure above atmospheric pressure to the extent of about 10 to 12 inches of water; the transparent door panel having a groove at the inner face of the door panel and traversing of the transparent panel from its center in radial directions oblique to each other, and an adjoining dry nitrogen nozzle directing a spray of nitrogen across the inner face of the transparent door panel and across one end of the groove in the door panel.

12 Claims, 7 Drawing Figures

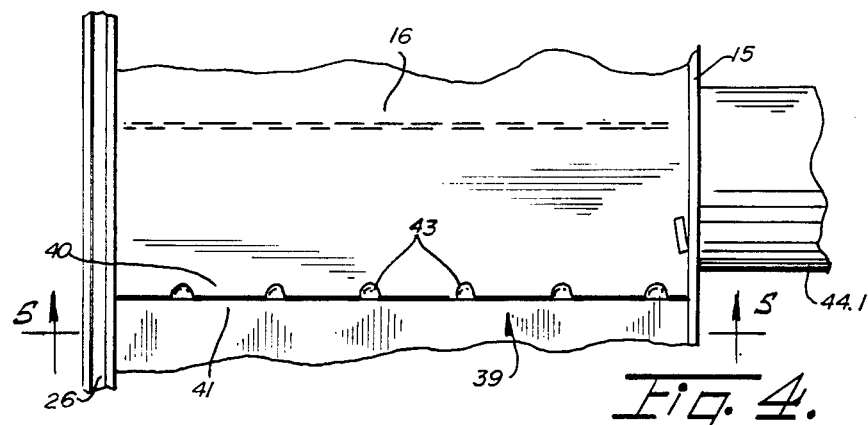
Fig. 4.
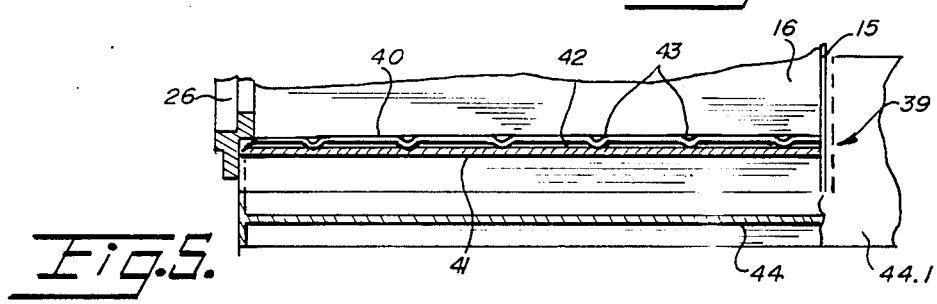
Fig. 5.
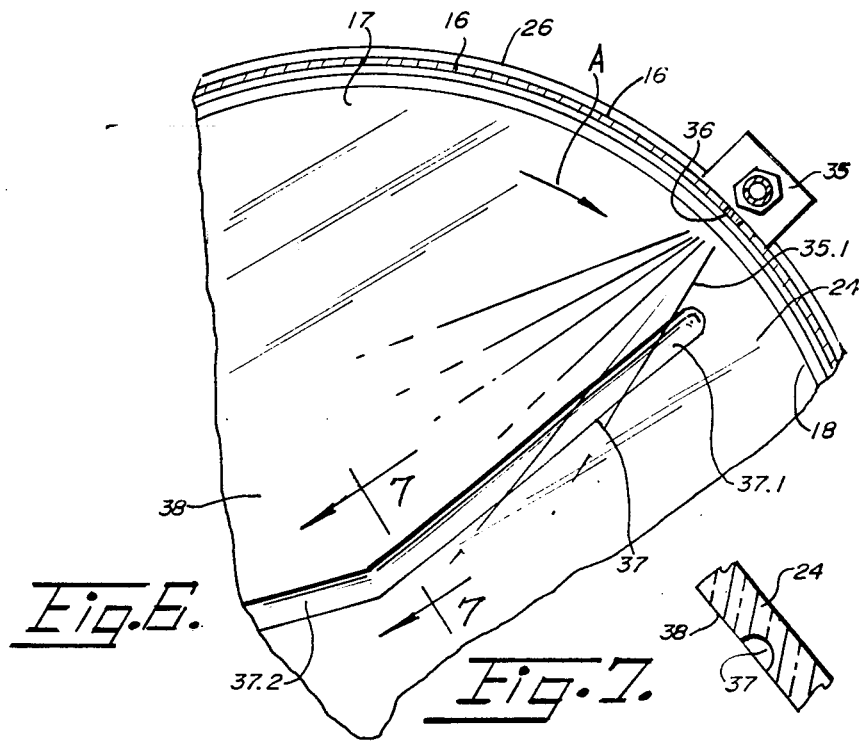
Fig. 6.
Fig. 7.

WAFER PROCESSING MACHINE

This invention relates to machines for centrifugal processing of silicon wafers in the manufacture of integrated circuit chips.

BACKGROUND OF THE INVENTION

In processing of such silicon wafers and the like the wafers are subjected to numerous process steps involving highly active liquid chemicals such acids and rinsing water, and gases which are generally used in drying the wafers between other process steps. Such liquids and gases are often applied by spraying onto the wafers in such centrifugal spray processing. The wafers are revolved in a closed processing chamber.

Processing machines defining such a process chamber are typically arranged with a wafer carrying rotor revolving on an upright axis, substantially as illustrated in U.S. Pat. Nos. 4,132,567 and 3,990,462. The housing defining the process chamber provides a drain in the bottom of the housing through which liquids and some gases are drained or evacuated from the chamber.

In other processing machines, the wafer carrying rotor may be arranged to revolve on a generally horizontal axis or on an axis inclined by a few degrees above the horizontal. In such a machine, as illustrated in U.S. Pat. No. 4,300,581, the liquid drainage and discharge of the gases occurs at the lower side of the generally cylindrical wall of the housing defining the process chamber. In that patent, the lowermost portion of the cylindrical peripheral wall simply has a slot extending parallel to the axis, and a drainage collector at the outside of the housing connects to a drain pipe for discharging the liquids and gases.

It has been found that the removal of all of the droplets of liquid from the walls of the processing chamber is difficult to accomplish with the equipment known previously. The droplets of rinsing water often remain on the peripheral wall of the chamber and on the inside face of the door, on the drying cycle in the processing machine is continued so long as to evaporate the liquid droplets. Previously, doors have incorporated a heating devices ask to vaporize liquid droplets which may collect thereon, but the use of such heating devices in the door is not practical in such doors that may incorporate a transparent panel.

SUMMARY OF THE INVENTION

An object of the invention is to minimize or prevent the collection of droplets of liquid on the inner peripheral wall and door of a centrifugal wafer processing machine, and particularly such a machine which is generally horizontally oriented with the axis of the rotor in a generally horizontal orientation.

Another object of the invention is to minimize the possibility of migration of ambient air and particulate that may be carried by the air, into the process chamber of a centrifugal wafer processing machine, the rotor of which revolves at high speed during certain functional cycles of the machine.

A feature of the invention is the provision in the peripheral sidewall of a generally horizontally oriented centrifugal spray processing machine for silicon wafers and the like, of a drain defined between the circumferential extending and overlapped edge portions of the sidewall spaced from each other and defining a drain slot between said edge portions and facing circumferentially of the the peripheral wall. The rotor in the processing chamber revolving in the same circumferential direction as the drain slot faces.

One of the circumferentially extending and overlapped edge portions has a multiplicity of deformations engaging the other edge portion maintaining the drain slot in a uniformly open condition along the length of the slot.

It has been found that under normal operating conditions of the spray processing machine, wherein the rotor is rapidly revolved during the portions of the cycle wherein the liquids are to be drained and the gases in the process chamber are to be vented through the drain slot, water droplets in the vicinity of the drain will quickly disappear and the moisture therefrom will be carried to the drain slot and out of the process chamber. Normally, a slight positive pressure in the range of ten inches to twelve inches of water is maintained in the process chamber during the evacuation of the liquids and gases and removal of the water droplets, but the removal of water droplets from the surface of the housing and peripheral wall is also satisfactory without the use of such pressure in the chamber.

The drain thus provided for discharging both liquids and gases from the chamber provides the advantage of assuring that all of the liquid droplets are removed from the surface of the chamber wall and this minimizes the likelihood of the migration of any moisture droplets back on to the wafers which are being processed and carried by the rotor.

Another feature of the invention relates to the removal of liquid droplets from the inside surface of the transparency panel of the door at the end of the process chamber wherein the rotor is on an axis oriented generally horizontally or a few degrees off from horizontal. The door or panel is provided with a shallow groove on its inner face and confronting the process chamber. The groove has opposite end portions, both extending from a central location on the panel which is intersected by the axis of the rotor, but the said end portions of the groove extend obliquely with respect to each other. A nozzle for dry nitrogen is mounted on the housing sidewall, adjacent one end of the shallow groove of the panel, and the nozzle directs a spray of gaseous nitrogen though the process chamber and transversely across the door or panel.

It has been found that with this arrangement, the water droplets which otherwise tend to collect on the door panel are quickly disposed of during the drying cycle of the process machine, during which the rotor is rapidly revolved as the dry nitrogen gas is directed inwardly of the process chamber and across the grooved panel. The result is that after the completion of the drying cycle, no visible water droplets remain on the door panel, nor are the water droplets visible in the groove which traverses the panel.

Another feature of the invention relates to the conducting of the process cycle under slight pressure in the process chamber. This pressure assists in discharging waste liquids and gases through the drain slot; and the pressure also tends to minimize the formation of the vacuum conditions between the baseplate of the turntable and the adjacent of the process chamber and thereby minimize the migration of the air and possible particulates carried thereby through the bearing and seal mounting of the rotary shaft in the end of the housing for supporting and revolving the turntable.

The advantaged obtained is the minimizing of a particulate in the processing chamber and the elimination of one more source of particulate as to prevent any contamination of the wafers being processed.

BRIEF DESCRIPTION OF DRAWINGS

FIG. 4 is an enlarged detailed section view taken approximately at 4—4 of FIG. 3.

FIG. 5 is detailed section view taken approximately at 5—5 of FIG. 4.

FIG. 6 is a detailed section view taken approximately at 6—6 of FIG. 1.

FIG. 7 is an enlarged detailed section taken approximately at 7—7 of FIG. 6.

DETAILED SPECIFICATION

Figure 1:
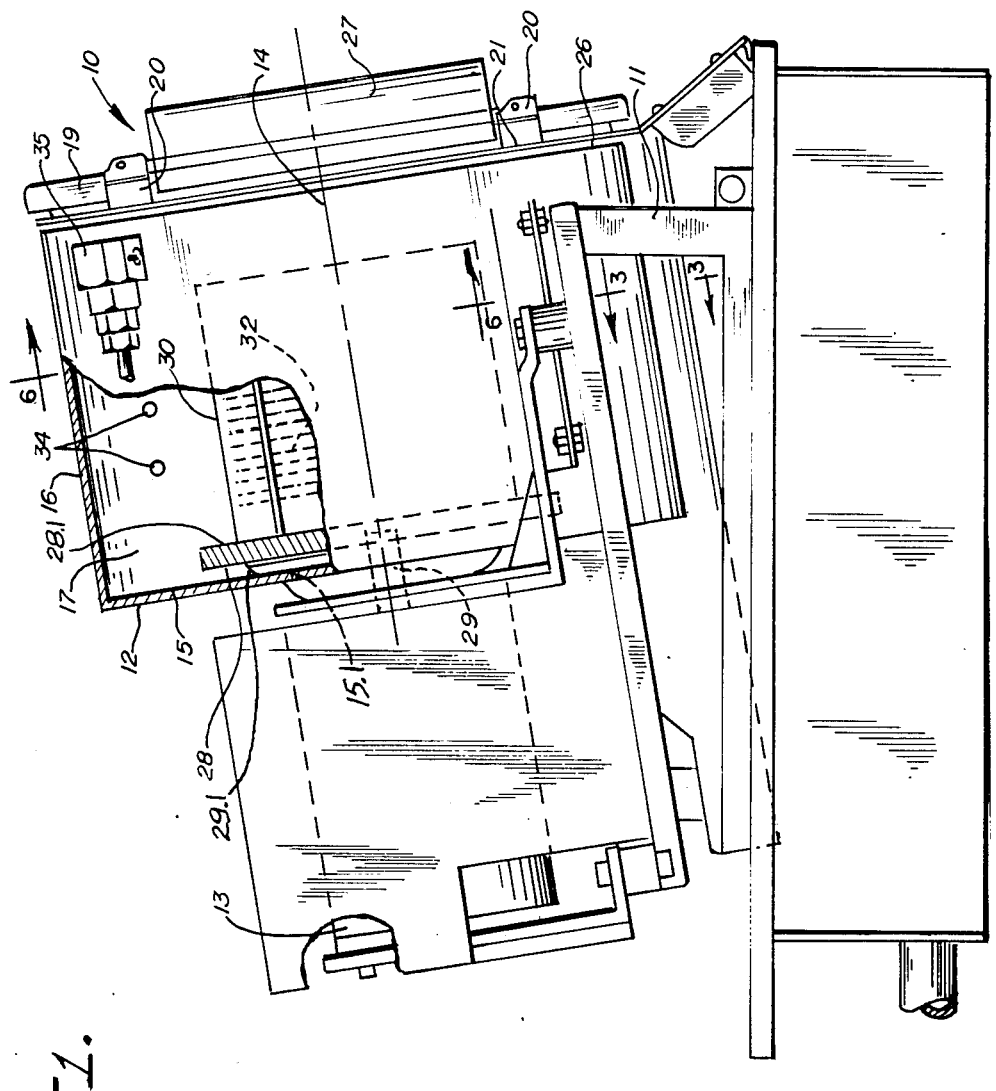
FIG. 1 is a side elevation view of the processing machine, with portions of the housing broken away for clarity of detail.

One form of the invention is illustrated in the drawing and is described herein.

The centrifugal processing machine is indicated in general by 10, and the machine is provided with a frame structure 11 upon which is mounted a bowl shaped housing 12, and a drive motor 13 mounted in a substantially horizontal position so that the rotation axis 14 of the motor 13 is oriented nearly horizontally, but slightly at an angle with the horizontal of approximately 5 to 10 degrees. The housing 12 has a base wall 15, and a substantially cylindrical peripheral sidewall 16 formed integrally of the base wall 15, or welded thereto. The housing 12 defines a generally cylindrical interior processing chamber 17. The peripheral sidewall 16 has an open front defining an access opening 18, and the access opening is normally closed by a swingable door 19 and mounted on a hinge structure 20 to the front panel 21 and frame of the machine. The opening 18 and door 19 provide access means into the processing chamber.

The door 19 has a peripheral frame panel 22 with a generally rectangular shape and is secured to the hinge structure 20. The frame panel 22 of the door has a central opening 23 to permit the visual access through the door 19. A transparent panel 24 of polycarbonate plastic or other similar transparent plastic material, lies against the frame panel 22 of the door at its inner side, and traverses the opening 23. The transparent panel 24 is affixed to the frame panel 22 by screws 25. The rim 26 on the front of the open end of the peripheral sidewall 16 seals against the periphery of the transparent panel 24 and is sealed there against as by a O-ring which extends around the periphery of the transparent door panel 24. A handle 27 is affixed to the frame panel 22 of the door to accommodate the opening and closing of the door.

A rotor indicated in general by a 28 is connected with the shaft 29 of the motor 13 which extends through the opening 15.1 in the base wall 15 and into the housing to be driven by the shaft. The turntable 28 has a base 28.1 of which lies in confronting, but the spaced relation with the base wall 15 of the housing. A seal 29.1 between the rotor 28 and the base wall of the housing minimizes and substantially prevents air leakage into or out of the housing. The rotor also includes a frame structure 30 to mount a wafer carrier 31 which carries a multiplicity of silicon wafers 32 substantially concentrically of the center line 14 and in the space relation with each other. The wafer carrier 31 may be as seen in U.S. Pat. No. 4,471,716. The frame structure 30 and wafer carrier 31 provide numerous openings so that liquid sprays and gases directed into the processing chamber 17 have access to the wafers 32 for processing the wafers.

A manifold nozzle 33 is mounted on the outside of the peripheral sidewall 16 of the housing. Nozzle 33 is connected to sources of process liquids and gases under pressure and directs such liquid and gaseous sprays, inwardly into the process chamber 17 through the multiplicity of spray ports 34 spaced along one length of sidewall 16. Liquids such as rinsing water, and in some cases wafer processing acids and other chemicals will be directed from the manifold nozzle 33 into the process chamber and onto the wafers. Gases such as dry nitrogen will also be directed into the processing chamber from the manifold nozzle 33 and through the spray ports 34 and for drying the interior of the processing chamber and the wafer 32 being processed and for establishing a positive pressure in the processing chamber 17. Such processing liquids and gases are supplied in such sequences as the processing may determine, and are controlled by valves in the flow lines.

Another nozzle 35 is mounted on the exterior of the housing sidewall 16 adjacent the door 19 and is also connected to a supply of dry nitrogen under pressure. Nozzle 35 directs dry nitrogen into the processing chamber 17 through a spray port 36. It will be recognized that the dry nitrogen is sprayed, as indicated at 35.1 inwardly of the processing chamber and traversing across the inner surface of the transparent door panel 24. Supply of nitrogen to nozzle 35 is controlled by valves in the flow lines, and the nitrogen is sprayed from nozzle 35 during the drying phase of the operating cycle of the machine.

Figure 2:
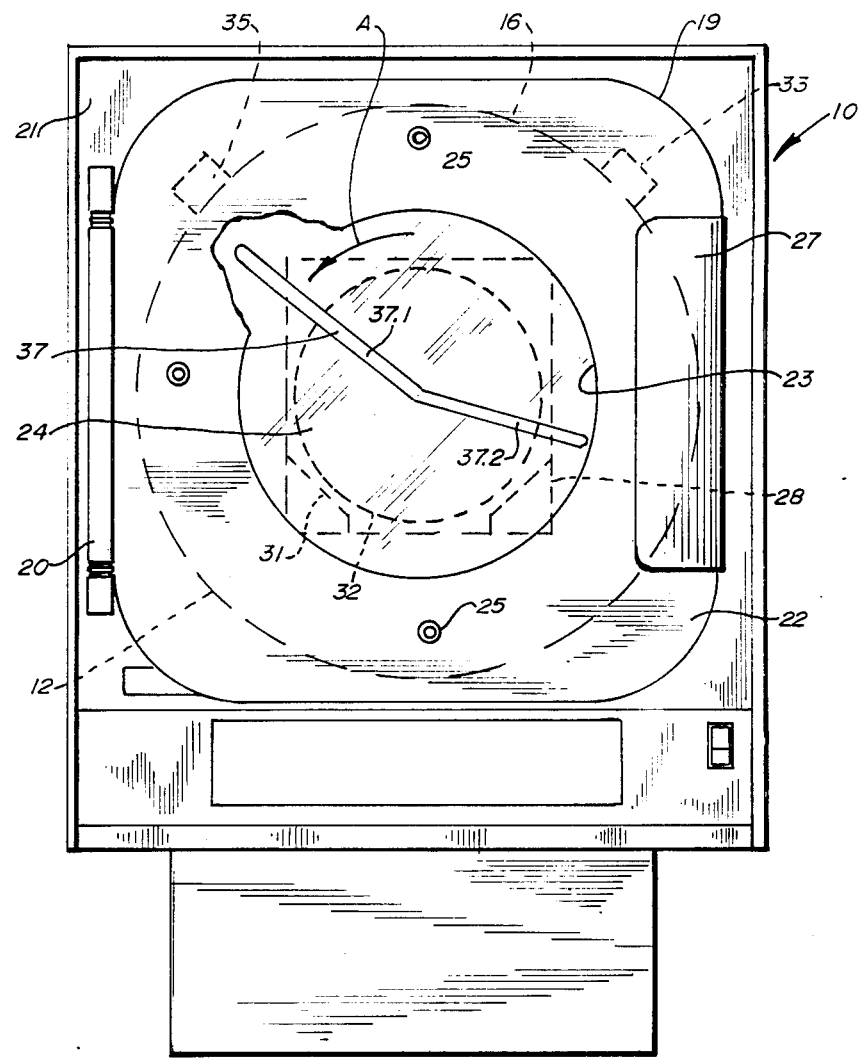
FIG. 2 is a front elevation view of the processing machine, with a portion thereof broken away for clarity of detail.

The transparent door panel 24 has an elongate groove 37 therein and located at the inner face 38 of the transparent panel 24 as to face into the processing chamber 17. The elongate groove 37 is seen in FIGS. 2, 6 and 7, and extends across the transparent panel with its opposite end portions 37.1 and 37.2 extending generally radially and linearly from the center or central portion of the panel 24 and outwardly into spaced relation with the outer periphery of the panel. It will be recognized that the opposite end portions of 37.1 and 37.2 of the groove extend obliquely of each other at an obtuse angle formed at the center of the panel 24 and substantially in alignment with the center line 14 of the motor 13 and the rotor 28. The end portion of 37.1 is disposed immediately adjacent the nozzle 35, the dry nitrogen from which traverses the end portion of 37.1 of the groove.

A drain apparatus, indicated in general by numeral 39 is provided at the lower side of the housing 12 and at the lower portion of the peripheral sidewall 16 thereof.

The lower portion of the peripheral wall 16 lies substantially parallel to the axis 14, and has a pair of circumferentially extending edge portions 40 and 41 which are arranged in overlapping relation with each other. The overlapping edge portions 40 and 41 are maintained in spaced relation to with each other to define a drainage slot 42 there between. The inner edge portion 40 of the peripheral sidewall has spaced means in the form of a multiplicity of dimple shaped deformations or undulations 43 formed therein as to lie against the edge portion 41 and assure that the drainage slot 42 is maintained in open condition all along the length of the sidewalls 16 between the ends thereof. Each of the dimple shaped deformations 43 is spot welded to the adjacent edge portion 41 against which the deformation 42 of 43 bears.

The drainage slot 42, although in a multiplicity of short segments between the dimple shaped deformations 43, functions as a continuous drainage slot for discharging all of the liquids and gaseous fluids from the processing chamber.

At the outer side of the peripheral sidewall 16, adjacent the overlapping edge portions 40 and 41, a generally semi-circular shroud 44 encloses the overlapping edge portions and drainage slot 42 and is welded to the housing sidewall 16 to receive and carry away the drainage liquids and exhaust gases being discharged from the process chamber. The shroud 44 takes the form of a conduit or duct 44.1 at the base wall of the housing to continue to carry away the fluids discharged from the processing chamber. The duct 44.1 is connected to a liquid drain and to a vent or stack to dispose of exhaust gases from the process chamber 17.

Figure 3:
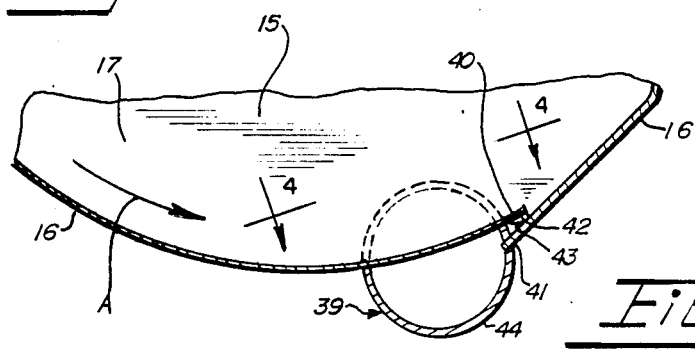
FIG. 3 is an enlarged detailed section view taken approximately at 3—3 of FIG. 1.

The motor 13 revolves the turntable 28 and the wafers 32 in the direction indicated by arrow A as seen in FIGS. 2, 3 and 6. It will be recognized that the inner edge portion of 40 of the peripheral sidewall 16 extends circumferentially in the same direction as the direction of rotation of the rotor as indicated by arrow A over the other edge portion 41 of the sidewall. The overlapping edge portions 40 and 41 of the sidewall define an offset in the sidewall 16 with the drainage slot 42 facing circumferentially of the peripheral sidewall 16 and facing in the same direction as indicated by arrow A which is the direction of rotation of the rotor 28. The drainage slot extends substantially linearly, and parallel to the rotation axis 14.

The direction of rotation as indicated by arrow A is also related to the positioning of the nozzle 35 in relation to the outer end portion of 37.1 of the groove 37 in the transparent panel 24. The end portion 37.1 of the groove is spaced circumferentially in the direction of arrow A from the spray port 36 in the peripheral wall adjoining the nozzle 35.

The manifold nozzle 33 and the dry nitrogen nozzle 35 are combined to supply gas under pressure into the processing chamber 17, and normally the pressure in the processing chamber 17 is maintained at a slight positive pressure above atmospheric pressure. Ordinarily about 10 inches to 12 inches of water pressure is maintained in the processing chamber.

The pressure in the chamber, taken together with the rapid movement of the gases and liquids in the chamber during the rinsing and drying steps of the process cycle produce the rapid flow of fluids being discharged through the drainage slot 42 of the drain apparatus 39. The effect of the offset in the peripheral sidewall produced by the overlapping edge portions 40 and 41 and the circumferentially facing drainage slot 42, together with the rapid rotation of turntable 28 to speeds of up to 3,000 rpm, and the positive pressure in the process chamber 17, is that all of the water droplets on the inner face of the peripheral sidewall are disposed of in such a matter that the water droplets will disappear quickly and be carried as vapor out of the housing and through the drainage slot and into the drain shroud and conduit 44.

The pressure maintained in the processing chamber also has the effect of minimizing or preventing the creation of any vacuum pressure between the base 28.1 of the rotor and the adjacent bottom wall 15 of the housing. Ordinarily this rapidly revolving base 29 confronting the base wall 15 of the housing will produce a vacuum pressure there between, tending to draw air through the base wall adjacent the shaft and certain particulate or contaminates with the air for producing a contaminated atmosphere within the processing chamber 17. However with the positive pressure in the chamber as described, the tendency to form a vacuum between the base 28.1 and the bottom wall 15 of housing is prevented or minimized and ingress of air with particulate is prevented or minimized.

During the drying cycle of the processing machine, and with the rotor 28 the continuing to revolve at high speeds, such as in the range of 3,000 rpm, the spraying of dry nitrogen from a nozzle 35, and traversing across the transparent panel 24 and across the groove 37 quickly produces the elimination of water droplets on the inner face 38 of the transparent panel. The particular reason for the elimination of water droplets from the inner face 38 from the transparency panel is not fully understood, but through observations made during the operation of the machine 10, the removal of the water droplets from the face 38 is rapid and visually discernable. Liquid droplets which would ordinarily move circumferentially on the face of the panel 24 appear to be eliminated as they encounter the groove 37; and it also appears as though substantial quantities dry nitrogen gas from the nozzle 35 travel rapidly along the groove 37 to encounter the water droplets that may approach and enter the groove. In any event, the end portions of the groove 37 at the inner face of the panel 24 disposes of all visible liquid droplets on the transparent panel 24 so as to minimize the possibility of any liquid returning onto the wafers 32 in the chamber.

That which is claimed:

1. A centrifugal processing machine for spray processing with liquid and gaseous fluids silicon wafers and the like in the manufacture of integrated circuit chips, comprising
a housing defining a processing chamber and having a high speed rotor means in the housing to mount and revolve such wafers in one direction about a rotation axis, the housing having an access means to accommodate the insertion and removal of such wafers for loading and unloading the rotor means, means for introducing the liquid and gaseous fluids into the housing, the housing having a smoothly contoured peripheral wall with an elongate portion extending along the rotor axis, said elongate portion having an offset with an elongate drain slot therein and facing circumferentially of the peripheral wall in said one direction, and shroud means on the exterior of the peripheral wall and enclosing said elongate portion and offset and communicating with the drain slot to receive the liquid and gaseous fluids discharged through the slot for delivery to a drain.

2. A centrifugal processing machine according to claim 1 wherein the peripheral wall has wall areas adjoining said the offset on opposite the sides thereof and spaced differently from said axis, relative to each other.

3. A centrifugal processing machine according to claim 1 wherein said elongate portion of the peripheral wall lies nearly horizontal.

4. A centrifugal processing machine according to claim 1 wherein said offset extends substantially parallel to the axis.

5. A centrifugal processing machine according to claim 1 wherein the peripheral wall has a circumferentially extending edge portions in overlapped and spaced relation to each other to define said offset and drain slot.

6. A centrifugal processing machine according to claim 5 and spacer means in the drain slot and maintaining the space relation between the overlapped edge portions of the peripheral wall to keep the drain slot open.

7. A centrifugal processing machine according to claim 6 wherein said spacer means comprise undulations in one of the edge portions and engaging the other edge portion of the peripheral wall, the undulations dividing the drain slot into slot segments.

8. A centrifugal processing machine according to claim 1 and means connected with the housing to create a positive gaseous pressure in the process chamber.

9. A centrifugal processing machine according to claim 8 and the housing having an end wall with a shaft opening therethrough adjacent the rotor means, the rotor means having a drive shaft extending through the shaft opening of the end wall and also having a base revolving in confronting and closely spaced relation to the end wall, the positive pressure in the chamber reacting against the effect of the revolving base adjacent the end wall which tends to establish a partial vacuum therebetween, to minimize ingress of air and particulate carried by the air into the process chamber through the shaft opening.

10. A centrifugal processing machine according to claim 1 and
   means establishing a positive pressure in the chamber, the housing having an end wall with a shaft opening therethrough adjacent the rotor means, the rotor means having a drive shaft extending through the shaft opening of the end wall and the rotor means also having a base revolving in confronting and closely spaced relation to the end wall, the revolving base adjacent the end wall tending to establish a partial vacuum therebetween, the positive pressure in the chamber flowing the gases and liquid particles out through the drain slot and also reacting against the effect of the partial vacuum to minimize ingress of air and particulate carried by the air into the process chamber through the shaft opening.

11. A centrifugal processing machine according to claim 1 wherein the axis of the rotor means is oriented nearly horizontal, the peripheral wall of the housing embracing the rotor means and axis, said peripheral wall having a lower side with said elongate portion and drain slots therein.

12. A centrifugal processing machine according to claim 1 wherein said rotation axis of the rotor means is oriented in a non-horizontal position.

* * * * *